United States Patent [19]

Kobayashi et al.

[11] Patent Number: 4,508,968

[45] Date of Patent: Apr. 2, 1985

[54] APPARATUS FOR PROCESSING NEGATIVE PHOTORESIST

[75] Inventors: Koichi Kobayashi, Yokohama; Kenichi Kawashima, Sagamihara; Shuzo Oshio, Kawasaki, all of Japan

[73] Assignee: Fujitsu Limited, Kawasaki, Japan

[21] Appl. No.: 510,584

[22] Filed: Jul. 5, 1983

Related U.S. Application Data

[62] Division of Ser. No. 329,941, Dec. 11, 1981, Pat. No. 4,426,439.

[30] Foreign Application Priority Data

Dec. 12, 1980 [JP] Japan .................. 55-175634

[51] Int. Cl.$^3$ .................. G01N 23/00; G01N 21/00
[52] U.S. Cl. .................. 250/441.1; 250/492.2
[58] Field of Search .................. 250/492.2, 441.1; 219/121 EL, 121 EQ; 378/34, 35; 430/331, 328

[56] References Cited

U.S. PATENT DOCUMENTS

| | | | |
|---|---|---|---|
| 3,643,058 | 2/1972 | Long | 250/441.1 |
| 4,185,202 | 1/1980 | Dean et al. | 378/34 |
| 4,239,787 | 12/1980 | Rentschler | 430/328 |
| 4,298,803 | 11/1981 | Matsuura et al. | 250/492.2 |

FOREIGN PATENT DOCUMENTS

| | | |
|---|---|---|
| 2945630 | 5/1980 | Fed. Rep. of Germany . |
| 95189 | 7/1978 | Japan . |
| 124397 | 10/1978 | Japan . |
| 68622 | 5/1980 | Japan . |
| 146932 | 11/1980 | Japan . |

OTHER PUBLICATIONS

NHK Laboratories Note, No. 253, dated Aug. 1980, Tokyo, pp. 3–14.

Primary Examiner—Bruce C. Anderson
Attorney, Agent, or Firm—Staas & Halsey

[57] ABSTRACT

A negative photoresist emulsion, wherein after a film of negative photoresist emulsion on a substrate has been exposed for pattern writing in vacuum to charged particle beams or soft X-ray beams, the film-coated substrate is transferred to, and kept in, a chamber filled with non-oxidizing gas, and then the substrate is removed to the outside atmosphere. By this method, a curing effect of the photoresist film is prevented, enabling formation of fine patterns with precision. An apparatus for carrying out the above method has a gas chamber filled with non-oxidizing gas connected to an exposure chamber, and the substrate, after such exposure, is kept in an atmosphere of non-oxidizing gas in the gas chamber before being removed to the outside atmosphere. In either the above-method or apparatus, the concentration of oxygen in the non-oxidizing gas must be less than 5%, preferably less than 1%.

6 Claims, 10 Drawing Figures

APPARATUS FOR PROCESSING NEGATIVE PHOTORESIST

This application is a division of U.S. Ser. No. 329,941, filed Dec. 11, 1981 U.S. Pat. No. 4,426,439.

BACKGROUND OF THE INVENTION

This invention concerns a method for processing negative photoresist emulsion, and more particularly, a method of keeping a film of negative photoresist emulsion in an atmosphere of gas not containing oxygen after exposure of said photoresist to electron beams and the like, and an apparatus for carrying out such a method.

As is generally known, the ability to form fine patterns of submicron size on a semiconductor substrate has been increasingly required to keep pace with the trend of high integration and maximum function density of semiconductor devices such as integrated circuits (IC). In preparing such fine patterns by the so-called mask process method employing the photolithography technique, the known art process of exposing the substrate to ultraviolet light has been found ineffective to form sufficiently fine patterns. Thus, various other methods of exposure to electron beams, X-ray beams, ion beams or deep ultraviolet light are being developed and actually practiced. However, many of these new exposure systems require a considerable amount of time. For example, in an electron beam direct pattern writing method in the field of electron beam exposure wherein electron beams directly hit the photoresist film formed on a semiconductor substrate or wafer without using any mask, the exposure step takes from 50 or 60 minutes to several hours, although highly precise and fine patterns can be formed.

In the method just described, exposure of negative photoresist to an electron beam is carried out in vacuum. When a wafer coated with such photoresist is moved from vacuum to the atmosphere immediately after termination of exposure to electron beams, it has been found that the size of the pattern exposed to electron beams at an early stage of the exposure operation, and the size of the pattern exposed to electron beams immediately before termination of the exposure operation, differ when developed.

The difference in pattern size corresponding to the length of the curing time that elapses before developing is due to the difference in the bridging effect. There is a relationship, as shown in the logarithmic scale of FIG. 1, between the width W or thickness T of the written pattern, which is shown on the vertical axis, and the length of curing time t after exposure, which is shown in the horizontal axis. If a wafer is kept in vacuum in an electron beam exposure apparatus from the time At when the pattern writing started, to the time Bt when the pattern writing is finished, the width W or the thickness T of each line which was written first and last, respectively, takes the value $T_A$ and $T_B$ shown on the vertical axis when the wafer is taken out of vacuum relatively soon after the exposure. There is thus the difference $(T_A - T_B)$ which is a substantial value in the widths or thickness of the lines written soon after the beginning and near the end of exposure. The phenomenon just described is called herein, the curing effect.

Despite the foregoing, if the wafer is kept for a considerable length of time in vacuum of the exposure apparatus after exposure of the wafer to electron beams, one hour for example, the time consumed in pattern writing becomes small relative to the time spent in the apparatus. In otherwords, since the time axis changes logarithmically, the change $(T'_A - T'_B)$ during the time $(At' - Bt')$ is small as shown in FIG. 1. This means that, when the wafer is kept in vacuum of the apparatus for a considerable length of time, there is practically very little change in the widths and thicknesses of the lines made in the first and last stages of the exposure.

In view of the facts described so far, measures must be taken to leave the wafer in vacuum for a certain length of time after the exposure is over. The above-described measure is necessary because even a slight difference in the pattern size is a significant defect in the formation of submicron patterns. However, such an operation delay drastically lowers the rate of operation of the electron beam exposure apparatus.

In order to eliminate the above-described drawback experienced with the conventional apparatus, an attempt was made to effectively utilize the exposure time by an apparatus wherein a part of the conventional apparatus is kept in vacuum and the substrates or wafers are successively transferred to that vacuum part. However, even with such a structure, handling of wafers in vacuum is extremely difficult and involves deterioration of the degree of vacuum. Because of this, there is another drawback in that the apparatus must be controlled very strictly.

The facts explained so far are scatteringly disclosed in various Japanese patent publications. Japanese patent publication (Unexamined) No. 124397 of 1978 published on Oct. 30, 1978 discloses an invention entitled: Transport Device. The apparatus according to the disclosed invention involves a technique for transferring articles irradiated with electron beams, ion beams, etc., in vacuum. In a paragraph on pages 1 and 2 of the specification in this publication, there appears a description that developments are being made to use electron beams and ion beams widely for treating and processing metals and other materials, for example, dissolution, blowout, welding, heat treatment, sputtering, etching, ion implantation and the like.

Japanese patent publication (Unexamined) No. 95189 of 1979 published on July 27, 1979 concerns an invention entitled: Electron Beam Exposure Device. On page 5 of the specification there is a description that a sub-chamber is kept air tight for pumping out air. Articles to be treated are transported from the sub-chamber which is thus kept in vacuum to an exposure chamber which also is kept in vacuum. On page 7 of the specification, there is a further explanation that the device is so arranged that once air is exhausted, the exposure process may continuously be made in vacuum.

Japanese patent publication (Unexamined) No. 68622 of 1980 published on May 23, 1980 discloses an invention entitled: Device for Exchanging Samples in an Apparatus for Electron Beam Pattern Writing. On page 4 of the specification carried therein is a description of a curing chamber which is kept in vacuum on the order of less than $10^{-4}$ Torr. The curing chamber is independent from a chamber where samples are loaded and unloaded, and its object is to carry out the curing of samples in vacuum according to the claim of the specification. On page 6 of the specification, there appears a description that when the pattern writing is over, samples are cured in vacuum without ejection of the mask to the outside atmosphere. Further, on page 7 of the specification, it is described that, for the purpose of improving exposure and stabilizing the width of the line of the pattern, curing in vacuum is necessary.

Japanese patent publication (Unexamined) No. 146932 of 1980 published on Nov. 15, 1980 is for an invention entitled: Device for Exchange of Samples in an Apparatus for Electron Beam Pattern Writing. On page 3 of the specification there is a description that in the photoresist that has been exposed to electron beams, polymerization progresses on the vacuum (in order of higher than $1 \times 10^{-4}$ Torr), and the width of the line of the pattern increases. After a lapse of a certain length of time, this trend subsides, and when the photoresist is placed in vacuum of less degree or in the atmosphere, the polymerization ceases. According to a description on page 5 of the specification, curing occurs when pattern writing is applied to the sample. After completion of the curing, the sample is taken out of the curing chamber, and while maintaining the chamber in vacuum, the sample is transferred to the next stage of the process. On page 16 of the specification, it is described that the device of the invention allows maintaining high degree of vacuum required for the curing.

None of these publications, however, discloses or suggests the method of, and apparatus for, keeping the sample that has been exposed to electron beams in an atmosphere of non-oxidizing gas.

SUMMARY OF THE INVENTION

It is therefore a general object of the present invention to solve the problems experienced in the conventional art by offering a novel method of keeping for a predetermined length of time in an atmosphere of non-oxidizing gas a substrate or wafer having negative photoresist emulsion thereon that has been exposed to electron beams.

It is another object of the invention to offer an improved electron beam exposure apparatus which eliminates the curing effect explained before and in which a mechanism is provided for introducing, and keeping for a predetermined length of time in a chamber filled with non-oxidizing gas, wafers that have been exposed to electron beams.

To achieve the foregoing objects of the invention, one embodiment of the method of the invention to provides that a film of negative photoresist emulsion on a substrate to be treated is exposed to charged particle beams or soft X-ray beams for pattern writing in vacuum to charged particle, then the substrate coated with the photoresist film is transferred to, and kept in, a chamber having an atmosphere of non-oxidizing gas, and finally the substrate is taken out of the chamber and put into the outside atmosphere.

In another embodiment of the method of the invention, oxygen is contained in the non-oxidizing gas at a rate less than five percent in volume but the optimum rate is less than one percent in volume.

In a further embodiment of the method of the invention, the method comprises the steps of: irradiating charged particle beams or soft X-ray beams onto a substrate coated with a film of negative photoresist emulsion to be treated for pattern writing exposure in vacuum, transferring the substrate in vacuum to a gas chamber connected to the chamber where exposure is carried out, shutting off the exposure chamber from the gas chamber, introducing non-oxidizing gas into the gas chamber and maintaining the substrate in an atmosphere of non-oxidizing gas, and removing the substrate from the atmosphere of non-oxidizing gas to the outside atmosphere.

In another embodiment of the method of the invention, the method comprises the steps of: irradiating charged particle beams or soft X-ray beams onto a substrate coated with a film of negative photoresist emulsion to be treated for pattern writing exposure, transferring the substrate in vacuum to a sub-chamber connected to the exposure chamber, shutting off the connection between the exposure chamber and the sub-chamber, introducing non-oxidizing gas into the sub-chamber and maintaining the substrate in an atmosphere of non-oxidizing gas, transferring the substrate in the atmosphere of non-oxidizing gas to a gas chamber connected to the sub-chamber, and removing the substrate from the gas chamber to the outside atmosphere.

In another embodiment of the apparatus according to the invention, a gas chamber filled with non-oxidizing gas is connected to an exposure chamber wherein charged particle beams are irradiated onto a film of negative photoresist on a substrate for pattern writing exposure, and the substrate, after exposure processing is over in the exposure chamber, is kept in an atmosphere of non-oxidizing gas of the gas chamber and then removed to the outside atmosphere.

In another embodiment of the apparatus according to the invention, a sub-chamber is interposed between the exposure chamber and the gas chamber.

The above and further objects and novel features of the invention will appear more fully from the following detailed description when read in connection with the accompanying drawings. It is to be expressly understood, however, that the drawings are not intended as a definition of the invention but are for the purpose of illustration only.

DESCRIPTION OF THE PREFERRED EMBODIMENTS

Figure 2:
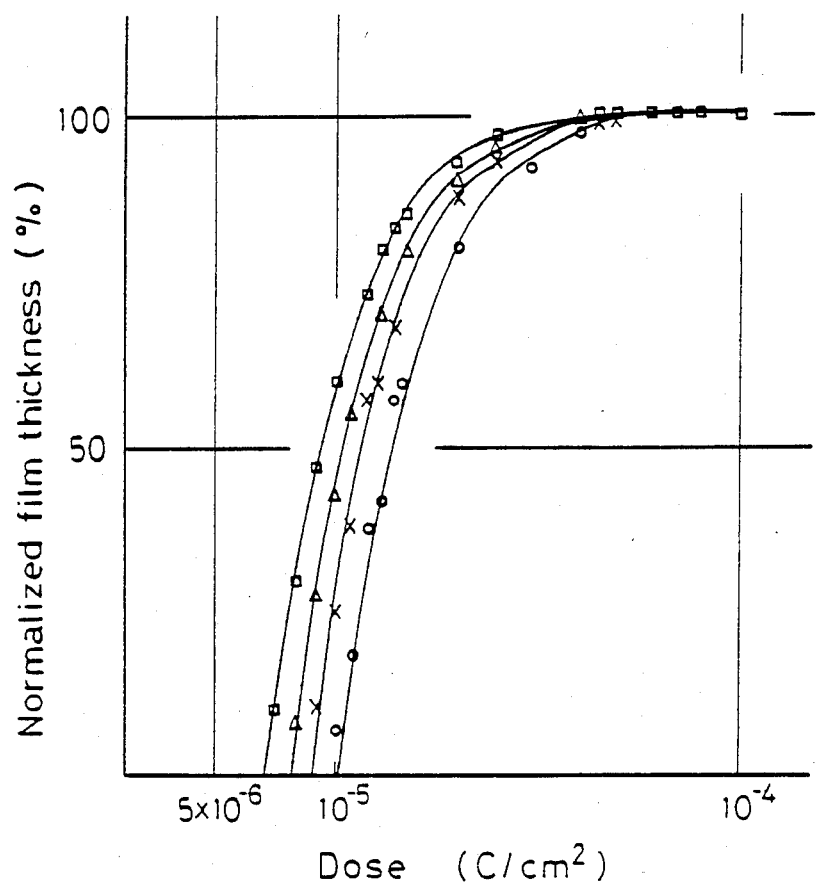
FIG. 2 is a diagram which illustrates the curing effect of negative photoresist emulsion.

In order to overcome the problems encountered in the prior art, the inventors in this application conducted some experiments. FIG. 2 shows one result of the experiments in which the horizontal axis represents irradiated electron beam dose in Coulomb per $cm^2$ and the vertical axis represents the normalized film thickness or the ratio of thicknesses of the photoresist film before and after the development (in %). The curves illustrate that the film thickness increases proportionately as the dose (in $C/cm^2$) increases.

Wafers were coated with negative photoresist emulsion, poly-diarylortho-phtalate (PDOP) for example, the photoresist film was prebaked at 60° C. for 20 minutes, and postbaked at 90° C. for 20 minutes. Wafers were taken out from vacuum as follows: soon after exposure without any curing time, and after curings which lasted 3 minutes, 10 minutes and 30 minutes, respectively. In FIG. 2 wafers with zero minute curing time are marked with circles, 3 minutes curing time with X marks, 10 minutes curing time with triangular marks and 30 minutes curing time with square marks respectively. The diagram shows that the normalized film thickness varies as the amount of dose changes, and increases as the photoresist is left in vacuum after exposure to electron beams. It is understood that this phenomenon is due to the curing or subsequent polymerization which takes a certain length of time before it levels off. The mode of the illustrated normalized film thickness varies as the exposure system and negative photoresist emulsion are changed. However, with the negative photoresist emulsion, the same trend is noted for all practical purposes. The width of a given pattern is proportionate to the normalized film thickness, and the thining in the width of a pattern makes it difficult to form fine patterns accurately.

The inventors assumed that radicals remaining in the photoresist after exposure to electron beams vanish in the presence of an active gas such as oxygen, and conducted some experiments. Typical examples found in the experiments are as follows:

| condition | thickness (in $\mu$m) of photoresist film | pattern width (in $\mu$m) |
|---|---|---|
| in normal atmosphere | 1.04 | 1.73 |
| in vacuum, 30 min. | 1.17 | 2.06 |
| in nitrogen, 30 min. | 1.16 | 2.02 |

Figure 3:
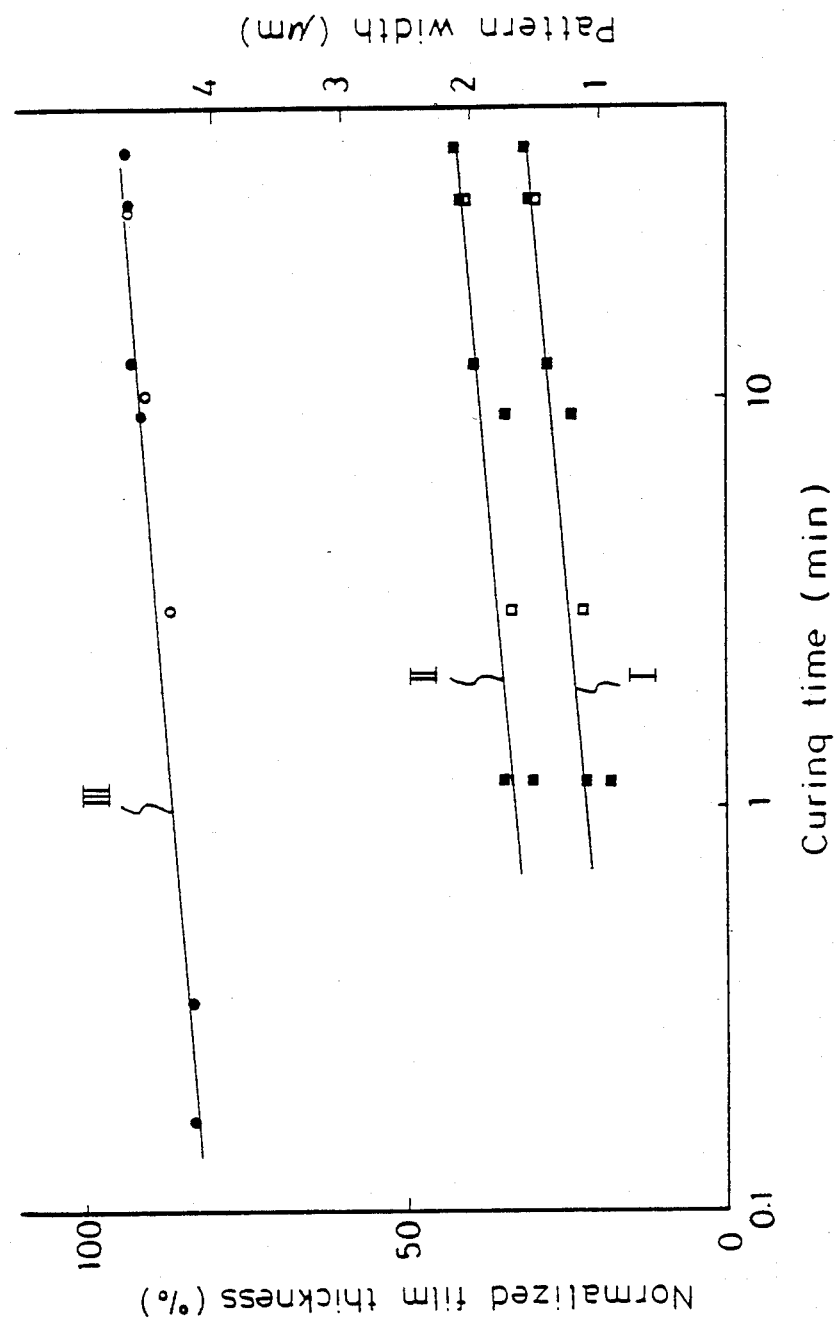
FIG. 3 is a diagram of the curing time vs. normalized film thickness or the ratio of thickness of film before and after development.

The result, obtained with Poly-Glycidyl-Metha-Acrylate (PGMA), photoresist emulsion shows that in an atmosphere of inactive gas such as nitrogen, subsequent polymerization progresses similar to that in vacuum. Film thickness of a pattern after development is substantially equal to that before development, with the pattern width of 2 $\mu$m not thinning noticeably. This makes it clear that the film pattern can be fabricated with a high degree of precision. Details of the experiments are shown in FIG. 3 in which the horizontal axis represents the curing time (in min.), the left vertical axis represents the normalized film thickness, and the right vertical axis represents the pattern width. In the diagram, the curve "I" concerns a pattern line 1.5 $\mu$m wide, curve "II" concerns a pattern line 2 $\mu$m wide, and curve III concerns the normalized film thickness. Negative phtoresist (polydiarylorthophtalate), initially 1.18 to 1.25 $\mu$m thick was prebaked at 60° C. for 20 minutes. An electron beam then irradiated the substrate with a dosage of $3.5 \times 10^{-5}$ C/cm$^2$ under the energy of 20 KeV. Dark circles and squares show the results obtained in vacuum, plain circles and squares the results obtained in nitrogen atmosphere.

Figure 4:
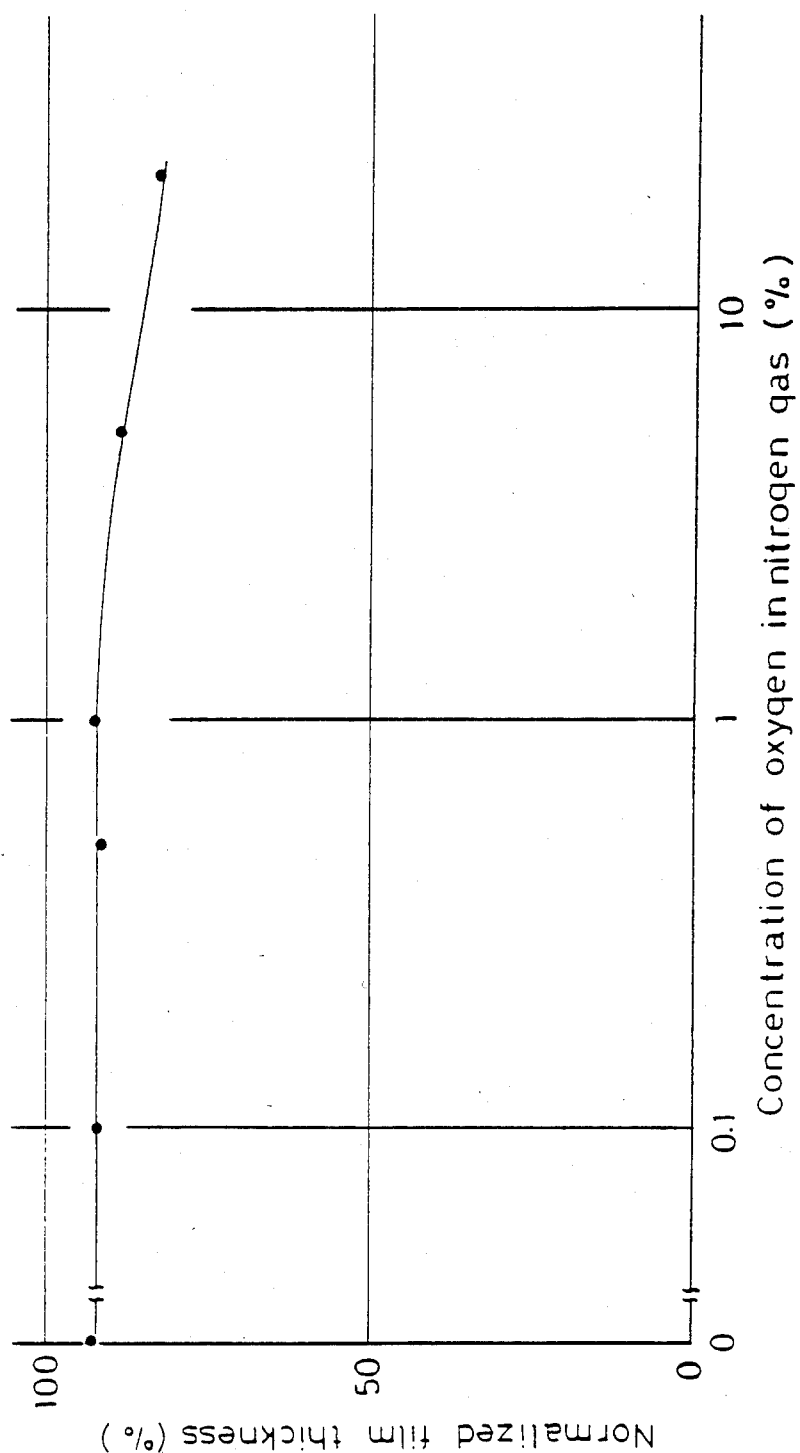
FIG. 4 is a diagram of the oxygen concentration in the curing gas vs. normalized film thickness.

In a further experiment, it was found that, where the volume ratio of oxygen in the gas to which the exposed negative photoresist was kept is less than 1%, ther was no change in the value of normalized film thickness thus being similar to when the negative photoresist was kept in vacuum. However, where oxygen concentration of the gas exceeds 5%, the normalized film thickness did change. Details are shown in FIG. 4 in which the horizontal axis shows the concentration (in %) of oxygen in nitrogen gas, and the vertical axis shows the normalized film thickness (in %). Negative photoresist of polydiarylorthophotalate, initially 1.2 to 1.25 $\mu$m thick was prebaked at 60° C. for 20 minutes. Dose of the electron beam was on the order of $3.5 \times 10^{-5}$ C/cm$^2$, and the curing time 30 minutes.

From the above, it is understood that the maximum volume of oxygen that can be contained in gas in which the negative photoresist emulsion is kept is five percent however, the optimum volum of oxygen is less than one percent.

And thus, according to a method of the invention, a substrate to be treated which is coated with negative photoresist emulsion is exposed in an exposure apparatus, and without removing the substrate the outside air, it is kept in a chamber filled with nitrogen gas from 30 minutes to one hour.

Figure 1:
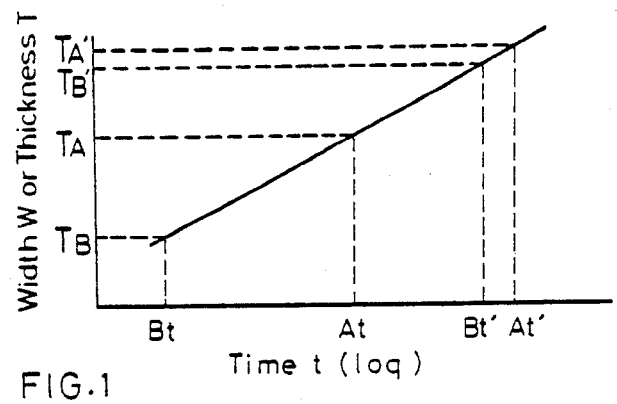
FIG. 1 is a diagram showing the width or thickness of written patterns vs. the length of curing time after electron beam exposure.
Figure 5:
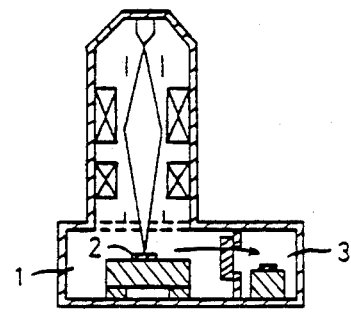
FIGS. 5, 6, 7A, 7B, 8 and 9 are schematic views of the apparatus for carrying out the method of the invention.

An apparatus according to the invention for carrying out the method described above is schematically illustrated in FIG. 5 for the purpose of explaining the principle of the invention. A semiconductor substrate 2 placed in a stage chamber 1 of an apparatus for electron beam exposure is exposed to electron beams in vacuum. Exhaustion of air to keep the stage chamber 1 in vacuum is stopped, and nitrogen gas is introduced into the chamber 1. The substrate 2 is then transferred as shown by an arrow in the drawing to a chamber 3 which has been filled with nitrogen gas. The substrate 2 is kept in chamber 3 from 30 minutes to one hour, and is subsequently removed to the outside air. The length of time during which the substrate 2 is kept in the nitrogen filled chamber 3 depends on the kind of negative photoresist emulsion and the type of exposure. The apparatus just described is effective in forming high precision patterns on a semiconductor substrate which are similar to the patterns obtained where the substrate is kept in vacuum after exposure. It was confirmed that in the illustrated apparatus, the rate of its operation has been improved considerably.

Figure 6:
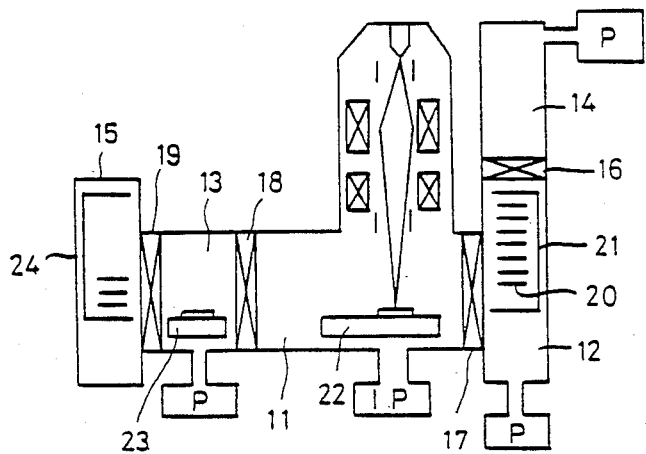

The method of the invention may also be carried out by an electron beam exposure apparatus as illustrated in FIG. 6. The shown apparatus comprises an exposure chamber 11, a loading chamber 12 and a store chamber 13 where substrates are temporarily kept. The loading chamber 12 is provided with a pre-exhausting chamber 14, and the store chamber 13 is provided with an unloading chamber 15. The pre-exhausting chamber 14 and the loading chamber 12 are connected by a gate valve 16 by which these chambers are either opened to, or shut off from, each other. The loading chamber 12 and the exposure chamber 11 are similarly connected by a gate valve 17. Likewise, the exposure chamber 11 and the store chamber 13 may be opened to, or shut off from, each other by a gate valve 18. Similarly, the store chamber 13 and the unloading chamber 15 are connected by a gate valve 19.

In operation, the gate valve 16 to the pre-exhausting chamber 14 and the gate valve 19 to the unloading chamber 15 are closed, and in the shown electron beam exposure apparatus, air is exhausted from the loading chamber 12, exposure chamber 11 and the store chamber 13 to keep these chambers in a high degree of vacuum. The unloading chamber 15 is filled with non-oxidizing gas in advance. A cassette 21 loaded with about ten wafers 20 is set up in the pre-exhausting chamber 14, then air in the chamber 14 is exhausted preliminarily. After this preliminary exhaustion of air is over, the gate valve 16 is opened, and the cassette 21 is transferred from the pre-exhaustion chamber 14 to the loading chamber 12 which is kept in a high degree of vacuum, and the gate valve 16 is closed. The first wafer 20 in the cassette 21 which has been transferred to the loading chamber 12 is then moved from the loading chamber 12 to an XY stage 22 in the exposure chamber 11 by a conventional transfer mechanism such as mechanical pick-up, not shown, and is set up. After the degree of vacuum in the exposure chamber 11 reaches a predetermined value, the first wafer 20 is irradiated by electron beams.

After the exposure is over, the wafer 20 is transported from its position on the XY stage 22 in the exposure chamber 11 to a sample stage 23 in the store chamber 13 by a known transfer mechanism, not shown. A second wafer in the cassette 21 is then transported from the loading chamber 12 onto the XY stage 22 in the exposure chamber 11 by the transfer mechanism mentioned before, and is set up. the gate valve 18 is closed to disconnect and shut off the exposure chamber 11 from the store chamber 13. After the degree of vacuum in the exposure chamber 11 attains a predetermined value, the second wafer is exposed to electron beams. While the second and next wafer are being exposed, the first wafer which is shut off from the exposure chamber 11 is recovered as will be described.

The gate valve 19 between the store chamber 13 and the unloading chamber 15 is opened to maintain the store chamber 13 in an atmosphere of non-oxidizing gas. Then, the first wafer 20 on the sample stage 23 in the store chamber 13 is carried into an empty cassette 24 in the unloading chamber 15 by a conventional transfer mechanism, not shown. After the first wafer has been placed in the cassette 24, the gate valve 19 is closed to shut off the unloading chamber 15 from the store chamber 13, and air is then exhausted from the store chamber 13 to keep it in a high degree of vacuum.

After exposure of the second wafer to electron beams in the exposure chamber 11, it should be ascertained whether the store chamber 13 is being maintained in a predetermined high degree of vacuum. After this is done, the gate valve 18 is opened, and the second wafer on the XY stage 22 in the exposure chamber 11 is carried, by the above-described transfer mechanism, to the sample stage 23 in the store chamber 13.

The third wafer in the cassette 21 is then transported, by the same transfer mechanism, from the loading chamber 12 onto the XY stage 22 in the exposure chamber 11. Thereafter, the steps described so far are successively repeated under the control of a program that has been prepared in a known manner in advance.

Wafers that have been exposed to electron beams are carried to the empty cassette 24 in the unloading chamber 15, are kept in a non-oxidizing atmosphere and retained in said cassette 24. After keeping these wafers in the unloading chamber 15 for a predetermined length of time, the wafers are removed to the outside atmosphere. It is preferable to design the store chamber 13 in a compact and small size so that the rate of exhausting air therein may be enhanced. Or, two such store chambers may be provided to be used alternately to improve the rate of operation of the exposure apparatus.

Figure 7A:
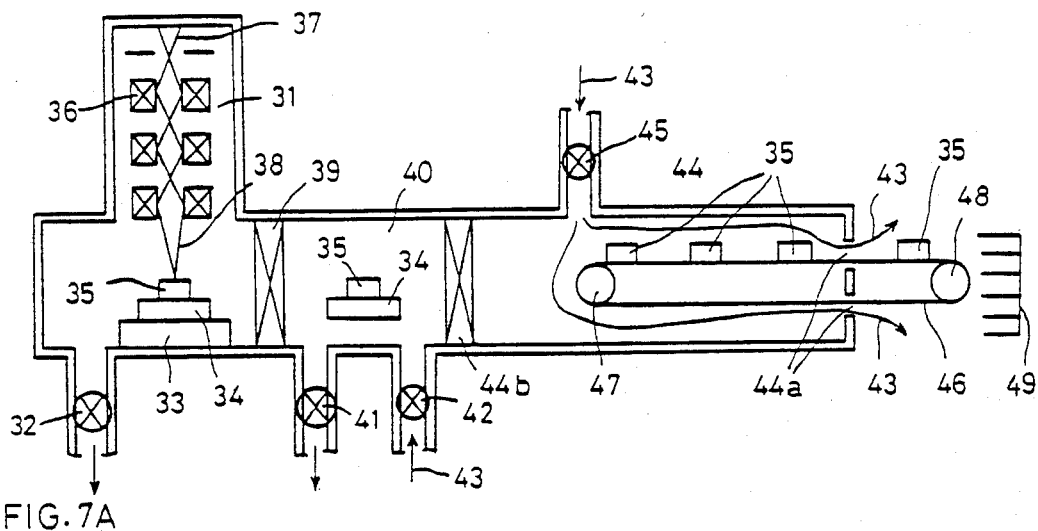
Figure 7B:
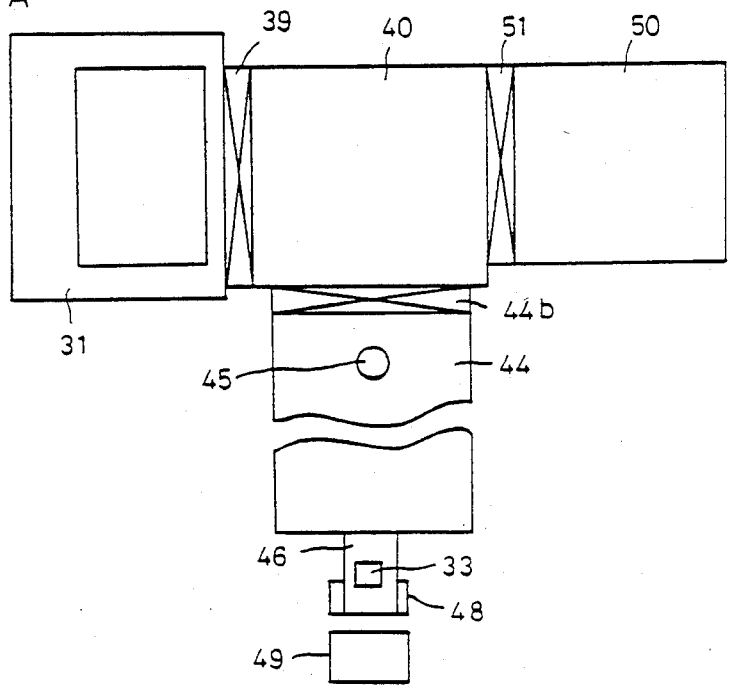

A further embodiment of the apparatus according to the invention is illustrated in FIGS. 7A and 7B. FIG. 7A is a schematic view prepared for the purpose of explaining the operation of the apparatus according to the invention, and FIG. 7B is a plan view which illustrates the layout of various parts of the apparatus. Air in a main chamber 31 of an apparatus for electron beam exposure is exhausted in a known manner by a vacuum pump (not shown) through an exhaust valve 32 to maintain the main chamber 31 in vacuum. An XY stage 33 is provided in the main chamber 31, and a sample such as a wafer 35 is placed on a sample holder 34 on the stage 33. Electron beams 38 to be used for electron beam exposure from a cathode 37 of an electron gun 36 of conventional structure are irradiated onto the sample 35 to write a predetermined exposure pattern. In this case, negative photoresist emulsion is coated on the sample 35 for pattern exposure. The sample 35 which has been exposed is taken out, loaded on the sample holder 34 and entered into a sub-chamber 40 through a first gate valve 39. When removing the sample 35 resting on the sample holder 34 to the sub-chamber 40, an exhaust valve 41 is opened for operation of a vacuum pump (not shown) to keep the sub-chamber 40 in vacuum in advance, and with the main chamber 31 being kept in operable vacuum, the first gate valve 39 is then closed. An inlet valve 42 is opened to introduce into the sub-chamber 40 non-oxidizing gas 43 which does not contain either oxygen or oxygen atoms, such as nitrogen, argon, helium or a mixture of these. When the pressure of the non-oxidizing gas 43 becomes the same as, or slightly higher than, that of the non-oxidizing gas in a gas chamber 44 to be described later, a third gate valve 44b is opened. The sample 35 is then removed from the sample holder 34 and taken into the gas chamber 44.

The above-described gas 43 enters into the gas chamber 44 through an inlet valve 45 and is exhausted through an exhaust or a second gate valve 44a, so that there is always a continuous flow of non-oxidizing gas 43. Internally of the gas chamber 44, there is provided a first roller 47 for a belt conveyer 46, and another second roller 48 is provided outside the gas chamber 44. The belt conveyer 46 surrounds these two rollers, and the samples 35 taken out of the sub-chamber 40 are successively placed on, and carried by, the belt conveyer 46. Samples 35 are gradually moved while staying within the gas chamber 44 for a predetermined length of time, during which time the curing effect described before takes place. The samples 35 then are taken out of the gas chamber 44 through the exhaust 44a, are exposed to the outside air for the first time and are placed in a cassette 49.

In order to place the next sample 35 into the main chamber 31, it will be introduced through a sample insert chamber 50 shown in FIG. 7B. A third gate valve 51 is opened, and the sample 35 is carried into the sub-chamber 40.

In the above-described operation, the insides of the sample insert chamber 50 and the sub-chamber 40 are kept in the same state as the outside atmosphere, and the curing is effected with the second gate valve 44a being closed. It will be clearly understood that the first gage valve 39 is closed, and when the next sample 35 is secured to the sample holder 34 in the sub-chamber 40, the exhaust valve 41 is opened to keep the sub-chamber 40 in vacuum, and then the first gate 39 is opened and the sample holder 34 with the sample 35 thereon is placed on the XY stage 33. And thus, the sample is positioned at a predetermined position ready for exposure.

In the above-described embodiment, the sample insert chamber 50 and the sub-chamber 40 are kept in the same condition as the outside atmosphere at the time the next sample is brought in. Where non-oxidizing gas 43 is introduced, the second gate 44a may be left open. It will be understood, that, because of this, the second gate valve 44a can be constructed easily becuase it is not subjected to severe conditions.

As described before, oxygen less than 5% in volume may be mixed to non-oxidizing gas during the curing vacuum-like pattern formation and, of course, a concentration of less than 1% can be mixed without affecting normalized film thickness. In case air comes in through the second gate valve 44a which is opened to allow movement of the belt conveyer, the volume of oxygen can be held down to less than 1% by continuously supplying more non-oxidizing gas.

Figure 8:
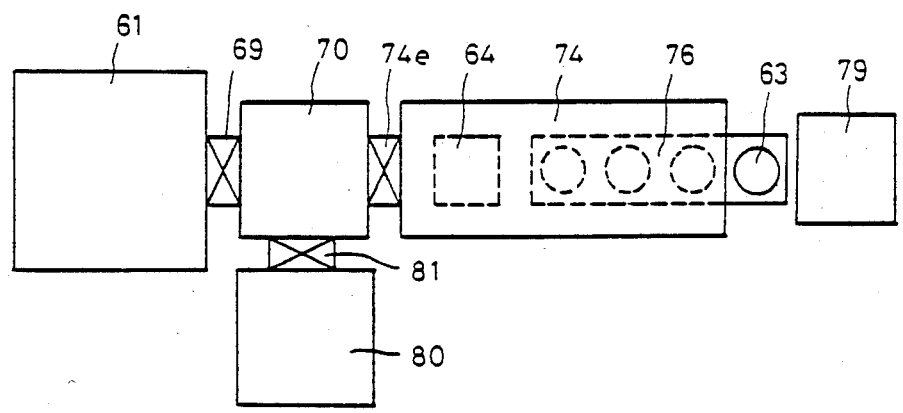

FIG. 8 shows another embodiment of the invention. With this embodiment, placing of a sample 63 on a sample holder 64 is not carried out in a sub-chamber 70 next to the main chamber 61. Instead, setting up of the sample 63 from a sample introduction chamber 80 and removal of sample 63 from a belt conveyer 76 into a cassette 79 are effected by means of the sample holder 64 provided in a gas chamber 74. Of course, this embodiment uses a series of gate valves 69, 81 and 74e between the various chambers.

By such an arrangement, there is no need to carry out setting up and removal of samples in a sub-chamber 70 which is built relatively small to keep it in a sufficient degree of vacuum for exposure operation. In the gas chamber 74, handling of the samples can very easily be performed.

Figure 9:
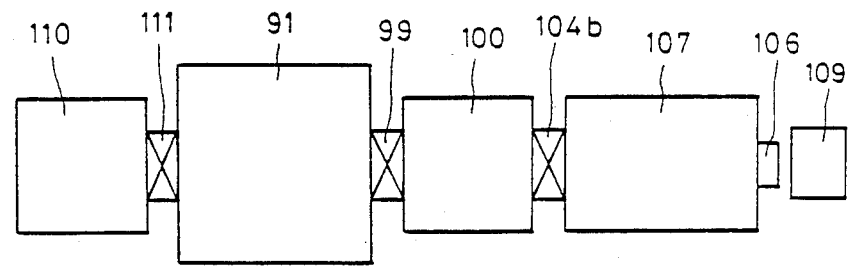

In FIG. 9 there is shown a further embodiment of the invention. A sample introduction chamber 110 is placed near one side of a main chamber 91. Because of this arrangement, the process is carried out using a belt conveyer 106 in one line of operation as follows: introduction of samples (in a sub-chamber 110) → exposure (in a main chamber 91) → curing (in sub-chamber 100) → removal of samples (in chamber 107) → placing of the samples in a cassette 109. This arrangement avoids the structure becoming too complex as when the sample introduction chamber 110 is annexed to a sub-chamber 100 or the gas chamber 107. Of course, this embodiment also uses a series of gate valves 111, 99, 104b between the various chambers.

As described in detail so far, the method of the invention makes it possible to form patterns with a high degree of precision not in vacuum but in non-oxidizing gas. Since samples to be exposed are moved in said gas, handling thereof is made easy. This serves the purpose of lowering the cost of manufacturing semiconductor devices such as highly integrated circuits.

Since the apparatus according to the invention is structured and operates as described above, continuous and effective exposure can be realized with little loss of time. As the samples are set up and removed not in vacuum, handling of the samples is simplified, and the samples show no signs of curing effect.

It should be stated also that the method and apparatus of the invention are not limited to the case where electron beams are used. The method and apparatus are just as effective where ion beams, soft X-ray beams and the like are employed.

Thus, the invention having been described in its best embodiment and mode of operation, that which is desired to be protected by Letters Patent is:

We claim:

1. An exposure apparatus comprising: a gas chamber filled with non-oxidizing gas and an exposure chamber connected to the gas chamber wherein charged particle beams are irradiated onto a substrate for pattern writing exposure, in which after exposure in said exposure chamber, said substrate is kept in non-oxidizing gas in said gas chamber and then taken out to the outside atmosphere.

2. An exposure apparatus of claim 1 wherein a sub-chamber is interposed between said gas chamber and said exposure chamber.

3. An apparatus of claim 1, further comprising: first valve means for isolating the interior of the gas chamber from the interior of the exposure chamber, wherein the first valve means connects the gas chamber and the exposure chamber.

4. An apparatus of claim 3, further comprising: air evacuation means for causing a vacuum in the exposure chamber and the gas chamber when the first valve means is opened, and for causing a vacuum in just the exposure chamber when the first valve means is closed, and a second valve means for introducing non-oxidizing gas into the gas chamber when the first valve means is closed.

5. An exposure apparatus of claim 2, further comprising: first valve means for isolating the interior of the exposure chamber from the interior of the sub-chamber, and second valve means for isolating the interior of the sub-chamber from the interior of the gas chamber, wherein the first valve means connects the exposure chamber and the sub-chamber, and the second valve means connects the sub-chamber and the gas chamber.

6. An apparatus of claim 5, further comprising: first air evacuation means for causing a vacuum in the exposure chamber, second air evacuation means for causing a vacuum in the sub-chamber when the second valve means is closed, and third valve means and fourth valve means for introducing non-oxidizing gas into the sub-chamber and the gas chamber, respectively, when the first value means is closed.

* * * * *

UNITED STATES PATENT AND TRADEMARK OFFICE
CERTIFICATE OF CORRECTION

PATENT NO. : 4,508,968
DATED : Apr. 2, 1985
INVENTOR(S) : Kobayashi et al.

It is certified that error appears in the above-identified patent and that said Letters Patent is hereby corrected as shown below:

Col. 3
Line 44, delete "to".

Col. 5
Line 58, "in" s/b --to--;
Line 58, "to" s/b --in--.

Col. 6
Line 12, after "substrate" insert --to--.

Col. 8
Line 54, "gage" s/b --gate--.

Signed and Sealed this

Thirteenth Day of August 1985

[SEAL]

Attest:

DONALD J. QUIGG

Attesting Officer     Acting Commissioner of Patents and Trademarks